United States Patent
D'Abreu et al.

(10) Patent No.: US 8,560,919 B2
(45) Date of Patent: Oct. 15, 2013

(54) SYSTEM AND METHOD OF INTERLEAVING DATA ACCORDING TO AN ADJUSTABLE PARAMETER

(75) Inventors: Manuel Antonio D'Abreu, El Dorado Hills, CA (US); Stephen Skala, Fremont, CA (US); Jayaprakash Naradasi, Bangalore (IN); Anand Venkitachalam, Bangalore (IN)

(73) Assignee: SanDisk Technologies Inc., Plano, TX (US)

(*) Notice: Subject to any disclaimer, the term of this patent is extended or adjusted under 35 U.S.C. 154(b) by 239 days.

(21) Appl. No.: 13/031,531

(22) Filed: Feb. 21, 2011

(65) Prior Publication Data

US 2012/0102379 A1  Apr. 26, 2012

(30) Foreign Application Priority Data

Oct. 22, 2010 (IN) .......................... 3126/CHE/2010

(51) Int. Cl.
*H03M 13/00* (2006.01)
(52) U.S. Cl.
USPC .......................... 714/758; 714/785; 714/778
(58) Field of Classification Search
USPC ......... 714/758, 785, 774, 778, 752, 780, 755, 714/766
See application file for complete search history.

(56) References Cited

U.S. PATENT DOCUMENTS

| | | | |
|---|---|---|---|
| 7,493,457 B2 | 2/2009 | Murin | |
| 7,971,130 B2* | 6/2011 | Ramamoorthy | 714/785 |
| 7,979,775 B2* | 7/2011 | Yu et al. | 714/755 |
| 8,219,885 B2* | 7/2012 | Bradley et al. | 714/766 |
| 2006/0101193 A1 | 5/2006 | Murin | |
| 2007/0180346 A1 | 8/2007 | Murin | |
| 2009/0070657 A1 | 3/2009 | Litsyn et al. | |
| 2009/0177943 A1 | 7/2009 | Silvus et al. | |
| 2010/0088557 A1 | 4/2010 | Weingarten et al. | |
| 2010/0238705 A1 | 9/2010 | Kim et al. | |

OTHER PUBLICATIONS

International Search Report and Written Opinion of the International Searching Authority mailed Jan. 26, 2012 in International Application No. PCT/US2011/055731, 10 pages.

* cited by examiner

*Primary Examiner* — Fritz Alphonse
(74) *Attorney, Agent, or Firm* — Toler Law Group, PC (57) ABSTRACT

A method in a data storage device with a memory includes receiving bit values to be stored at a set of cells of the memory and interleaving the received bit values to form multiple interleaved groups of data bits according to an adjustable parameter. The method also includes writing the multiple interleaved groups of data bits to the set of cells.

30 Claims, 6 Drawing Sheets

SYSTEM AND METHOD OF INTERLEAVING DATA ACCORDING TO AN ADJUSTABLE PARAMETER

FIELD OF THE DISCLOSURE

The present disclosure is generally related to interleaving data.

BACKGROUND

The capability to store data in memory devices continually improves with advances in technology. For example, flash memory enables non-volatile storage of data with a storage density that can be enhanced by storing multiple data bits per memory cell. However, data written to a memory may be unintentionally altered due to physical conditions of the memory, such as thermal noise, cosmic rays, or damage to physical components of the memory. Error correction coding (ECC) schemes are often used to correct errors that may occur in data. Such ECC schemes typically include encoding the data using redundant information, providing robust recovery from errors but also increasing manufacturing cost and reducing data storage density of the memory device. Improvements to an error correction capability of memory devices may enable enhanced operation or reduced cost of such devices.

SUMMARY

Data interleaving is performed according to an adjustable parameter. The adjustable parameter can indicate, for example, an interleave size or a number of interleaves per unit of data for data that is to be stored at a memory device. A value of the adjustable parameter can be set to enable higher-speed operation with fewer interleaves when few errors are expected or to enable a higher level of error recovery when a larger number of errors are expected.

For example, in a multi-level cell (MLC) flash memory device, data that is stored as most significant bits (MSBs) of a set of MLC cells may be more susceptible to errors than data stored at other bit positions of the MLC cells. As a number of errors in the data stored at the MSBs increases, such as due to device aging, the adjustable parameter may be programmed to increase an amount of interleaving between data stored at the most significant bit position and data stored at other bit positions within the set of MLC cells. As a result, errors occurring at the most significant bit position of the cells may be distributed over several data words, reducing a peak number of errors occurring in any single data word and thereby improving an effective error correction capability of the flash memory device.

DETAILED DESCRIPTION

Figure 1:
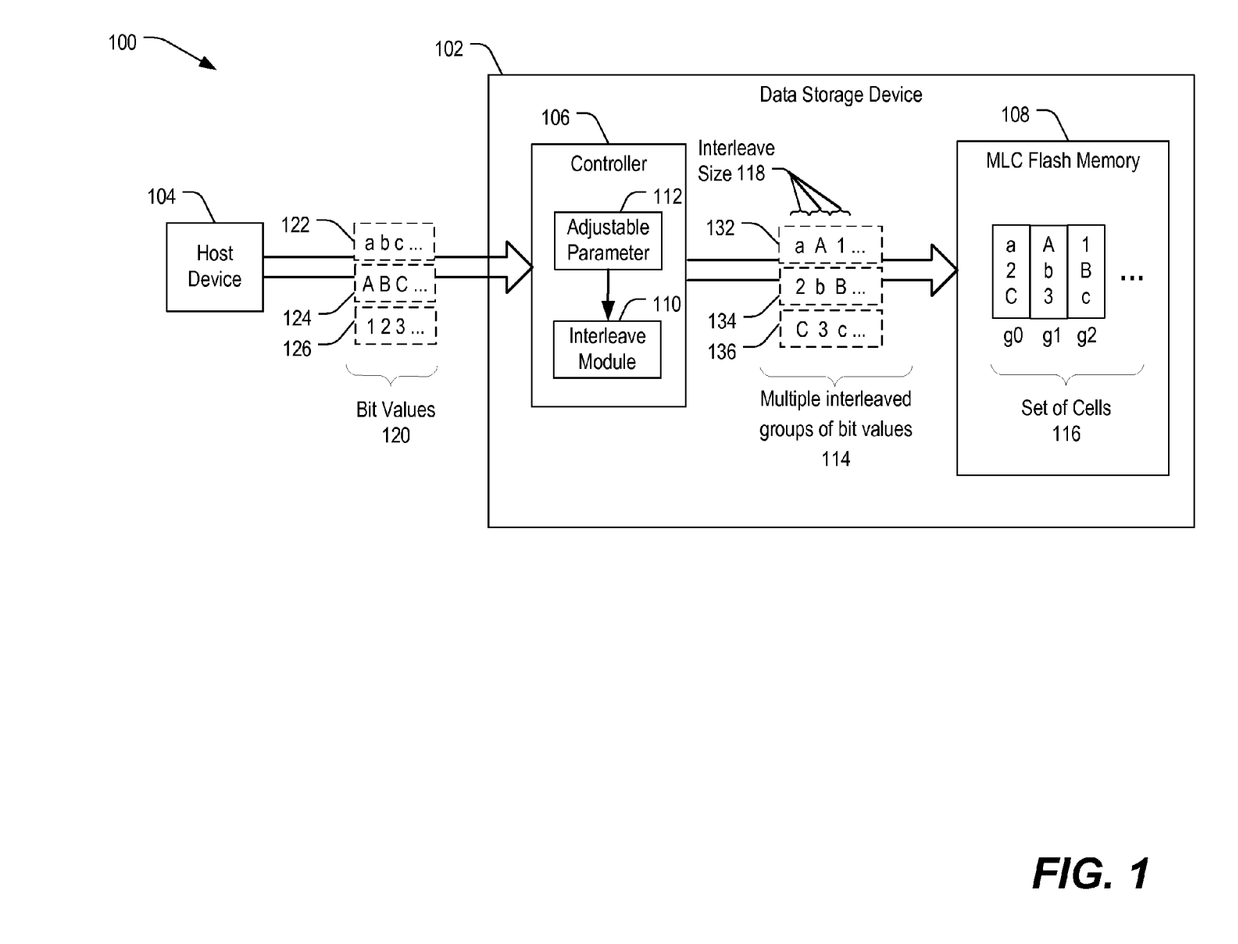
FIG. 1 is a block diagram of a particular illustrative embodiment of a system to interleave bit values according to an adjustable parameter.

Referring to FIG. 1, a particular embodiment of a system to interleave bit values according to an adjustable parameter is depicted and generally designated 100. The system 100 includes a data storage device 102 operably coupled to a host device 104. The data storage device 102 includes an interleave module 110 that is responsive to an adjustable parameter 112 to form multiple interleaved groups of data bits 114. As a result of interleaving groups of data bits according to the adjustable parameter 112, errors that may occur during data storage may be substantially equalized across the groups of data bits.

The host device 104 may be configured to provide bit values 120 to be stored at the data storage device 102. For example, the host device 104 may include a mobile telephone, a music or video player, a gaming console, an electronic book reader, a personal digital assistant (PDA), a computer such as a laptop computer or notebook computer, any other electronic device, or any combination thereof.

The bit values 120 are illustrated as a first group of bit values 122 including sets of bits, illustrated as set 'a,' set 'b,' and set 'c,' a second group of bit values 124 including sets of bits, illustrated as set 'A,' set 'B,' and set 'C,' and a third group of bit values 126 including sets of bits illustrated as set '1,' set '2,' and set '3.' Each of the sets in the groups of bit values 122, 124, and 126 may represent one or more bits of a data stream. For example, set 'a' represents a set of bits that may include a single bit value or multiple bit values. The bit values 120 may be received from the host device 104 at the data storage device 102 as a single stream of data. For example, the first group of bit values 122 may be received in a stream of data bits followed by the second group 124, and the second group 124 may be followed by the third group 126 in the stream of data bits.

The data storage device 102 includes a controller 106 coupled to a MLC flash memory 108. To illustrate, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 104 as embedded memory, such as eMMC® (trademark of JEDEC Solid State Technology Association, Arlington, Va.) and eSD, as illustrative examples.

The controller 106 is configured to receive the bit values 120 to be stored at a set of cells 116 of the MLC flash memory 108. The controller 106 includes the interleave module 110 responsive to the adjustable parameter 112. By operation of the interleave module 110, the controller 106 is configured to interleave the received bit values 120 to form multiple interleaved groups of data bits 114 according to the adjustable parameter 112. The controller 106 is further configured to write the multiple interleaved groups of data bits 114 to the set of cells 116.

The multiple interleaved groups of data bits 114 are illustrated as having a relative physical transposition of the sets of data bits between the groups 122, 124, and 126. As illustrated, the interleaving between the received groups 122-126 has a regular interleave size 118 that corresponds to the size of each set of bits. For example, when the set 'a' has a single bit, the interleave size 118 is a single bit. Alternatively, when the set 'a' includes multiple bits, the interleave size 118 corresponds to the number of bits of the set 'a.'

After interleaving, bits from the first group 122 may be substantially equally distributed among a first interleaved group of data bits 132, a second interleaved group of data bits 134, and a third interleaved group of data bits 136. Likewise, the data bits of the second received group 124 may be substantially equally distributed among the multiple interleaved groups 132-136. In addition, the data bits of the third received group 126 may be substantially equally distributed among the multiple interleaved groups 132-136.

The MLC flash memory 108 is configured to store the received multiple interleaved groups of data bits 114 at the set of cells 116. For example, each cell of the set of cells 116 may be configured to store multiple bit values, such that a most significant bit value corresponds to a bit from the first interleaved group of data bits 132, a middle bit value corresponds to a bit value from the second interleaved group of data bits 134, and a least significant bit corresponds to a bit value from the third interleaved group 136.

The set of cells 116 is illustrated as having a first group of cells g0 that stores a first set of bits from each of the interleaved groups 132-136, a second group of cells g1 that stores a next set of bits from each of the interleaved groups 132-136, and a third group of cells g2 that stores a third sequential set of bits from each of the interleaved groups 132-136. A number of cells in each group g0-g2 may correspond to a number of bits in each set of bits. For example, if each set of bits 'a,' '2,' and 'C' includes eight bits, the group g0 may include eight memory cells so that each cell stores a single bit from each set 'a,' '2,' and 'C.' As another example, if each set of bits 'a,' '2,' and 'C' includes a single bit, the group g0 may include a single memory cell.

An error rate that occurs in data stored at the MLC flash memory 108 may correspond to which bit position within the set of cells 116 the data is stored. For example, the most significant bit of a cell of the set of cells 116 may be statistically more likely to experience a corrupting event than the least significant bit of the cell. Thus, by interleaving the bit values 120 into the multiple interleaved groups of data bits 114 prior to writing to the set of cells 116, a probability of error occurring to data bits of each group 122-126 may be substantially equalized between the groups 122-126 because portions of each of the groups 122-126 are distributed among different bit positions, further described with respect to FIG. 2.

During operation, the controller 106 may be coupled to the host device 104 and may receive the bit values 120 from the host device 104. The controller 106 may provide the bit values 120 to the interleave module 110. The interleave module 110 may access the adjustable parameter 112 corresponding to the set of cells 116. The interleave module 110 may determine the interleave size 118 or a number of interleaves based on the adjustable parameter 112. As an illustrative example, a parameter value of two may indicate that two interleaves are to be used and a parameter value of three may indicate that three interleaves are to be used. The interleave module 110 may generate the multiple interleaved groups of data bits 114 and the controller 106 may provide the multiple interleaved groups of data bits 114 to be written to the set of cells 116.

The controller 106 may also be responsive to a request from the host device 104 to retrieve data from the set of cells 116. The controller 106 may retrieve the multiple interleaved groups of data bits 114 that may contain one or more errors that occurred during storage at the MLC flash memory 108. The controller 106 may be configured to provide the read data to the interleave module 110. The interleave module 110 may be configured to de-interleave the read data and provide the de-interleaved data to an error correction code (ECC) engine, as described with respect to FIG. 3. The ECC engine may correct the errors in the de-interleaved data and generate the bit values 120 to be provided to the host device 104.

By interleaving the bit values 120 according to a value of the adjustable parameter 112, an interleave granularity within the multiple interleaved groups of data bits 114 may be selectively applied to the bit values 120 to accommodate an expected error rate during storage at the MLC flash memory 108. For example, when a lower error rate is expected, the adjustable parameter 112 may indicate that no interleave is to be performed to the data. However, as more errors are expected to occur, such as when the MLC flash memory 108 is nearing a predicted end of its useful life, the adjustable parameter 112 may be adjusted to cause the groups 122-126 to be interleaved in order to reduce a peak expected amount of errors occurring at the set of cells 116 and to distribute errors across the multiple groups 122-126 of data, as described further with respect to FIG. 2.

Figure 2:
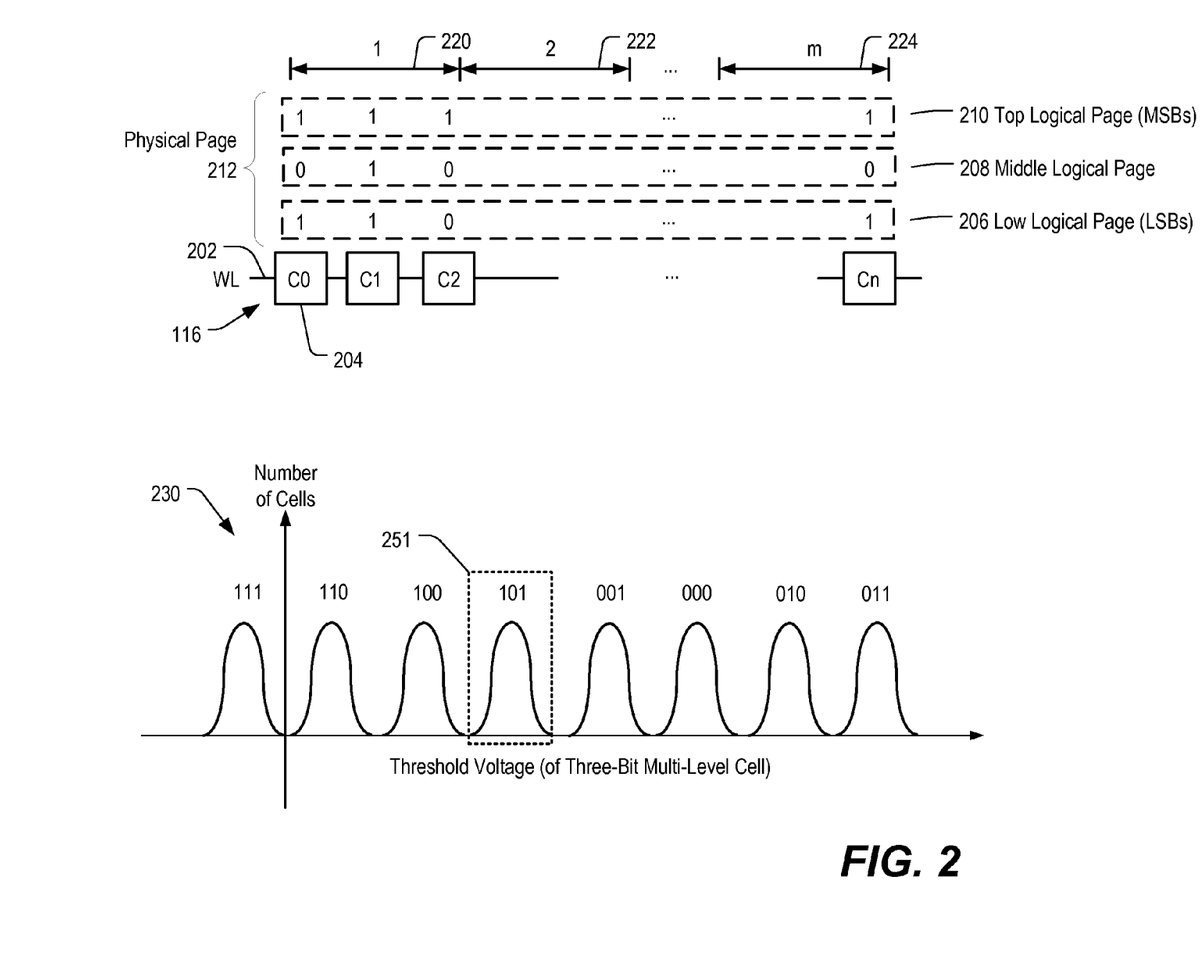
FIG. 2 is a general diagram of a particular illustrative embodiment of data storage at the set of memory cells 116 of FIG. 1.

Referring to FIG. 2, an example of the set of cells 116 storing multiple interleaved groups of data bits is depicted. The set of cells 116 is illustrated as having multiple cells labeled C0, C1, C2 . . . Cn. The cells C0-Cn are coupled to a single word line (WL) 202. Each of the cells C0-Cn is configured to store a multiple-bit data value, illustrated as a 3-bit MLC data value. For example, the cell C0 204 is illustrated as storing a 3-bit value of '101,' having a most significant bit (MSB) value of '1,' a middle bit value of '0,' and a least significant bit (LSB) value of '1.' Likewise, the cell C1 stores a 3-bit value of '111,' the cell C2 stores a 3-bit value of '100,' and the cell Cn stores a 3-bit value of '101.'

The most significant bit of each of the cells C0-Cn is shown in a logically grouped set of cells representing a top logical page 210. The middle bits of each of the cells C0-Cn are shown logically grouped as a middle logical page 208, and the least significant bits of each of the cells C0-Cn are shown grouped as a low logical page 206. The logical pages 206-210 may correspond to a single physical page 212. The physical page 212 may correspond to the data bits stored in all of the cells C0-Cn coupled to the word line WL 202.

A representative threshold voltage characteristic of a 3-bit multilevel cell is illustrated in a cell voltage distribution (CVD) 230. For example, the CVD 230 illustrates a distribution of cells programmed to particular threshold voltages and a 3-bit value corresponding to each particular voltage range. For example, a 3-bit value of '101,' such as stored in the cell C0 204, corresponds to a threshold voltage within a fourth threshold voltage range 251 of the eight identifiable threshold voltage ranges. The cell C0 204 may therefore be programmed to a particular threshold voltage within the fourth threshold range 251 that corresponds to the data value '101.'

The data stored in the top logical page 210 may be more susceptible to errors than data stored at the low logical page 206. For example, the data stored at the top logical page 210 may be more sensitive to threshold voltage shifting due to thermal effects, cosmic rays, or other effects such as write disturbance. However, in other embodiments one or more of the other logical pages 206-208 may exhibit a higher sensitivity to errors than the top logical page 210. In order to more evenly distribute a likelihood of errors in each of the pages 206-210, the data stored in the set of cells 116 is interleaved with a first interleave 220, a second interleave 222, to an m-th interleave 224. The number of interleaves per page (i.e., per physical page or per logical page), illustrated as 'm,' may be determined by the adjustable parameter 112 of FIG. 1.

Figure 3:
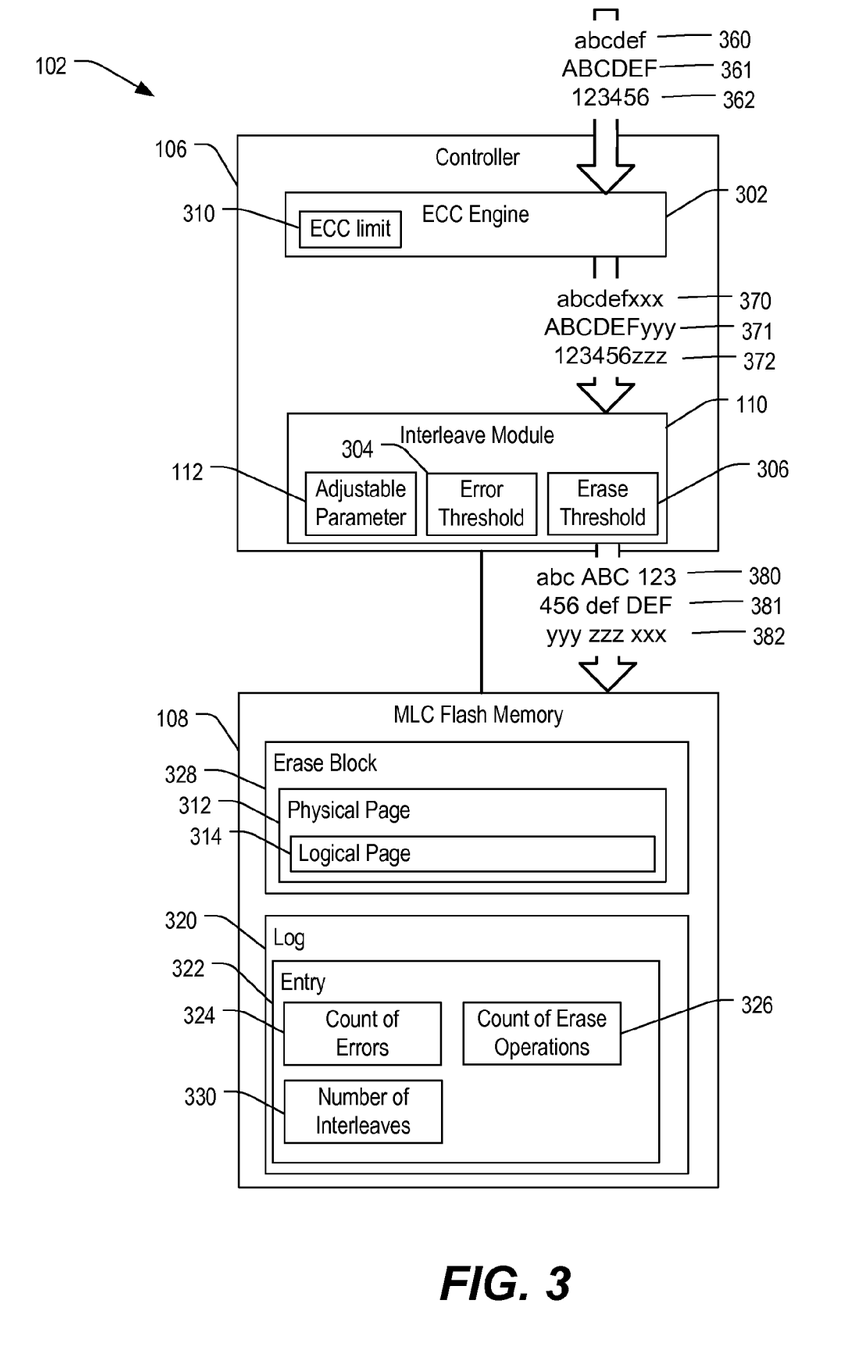
FIG. 3 is a block diagram of a particular illustrative embodiment of the data storage device 102 of FIG. 1 during a write operation that includes data encoding and interleaving.

Referring to FIG. 3, an example implementation of storing data to the data storage device 102 of FIG. 1 is depicted. The data storage device 102 is illustrated in FIG. 3 as having the controller 106 that includes an ECC engine 302 and the interleave module 110. The controller 106 is coupled to the MLC flash memory 108.

The ECC engine 302 is configured to encode data using an ECC scheme that enables correction of errors up to an ECC limit 310 and to correct a number of errors in retrieved data that has been encoded using the ECC scheme. Data having a number of errors that exceeds the ECC limit 310 may be uncorrectable by the ECC engine 302. Thus, by more evenly distributing an error likelihood among multiple groups of data bits for storage in the MLC flash memory 108, an expected peak likelihood of error in any single logical page may be reduced. A reduced peak likelihood of errors may extend a useful life of the data storage device 102 because the life of the data storage device may be limited by the ability of the ECC engine 302 to correct a peak number of errors occurring in a single logical page. Alternatively, or in addition, the data storage device 102 may be manufactured in a more cost effective manner and the data stored at the nonvolatile memory 108 may be stored in a more efficient manner by reducing a correction capability of the ECC engine 302 to use fewer redundant bits per unit of the data stored.

The ECC engine 302 is configured to receive data such as a first logical page 360, a second logical page 361, and a third logical page 362. The ECC engine 302 may be configured to independently encode each of the logical pages 360-362 according to an ECC scheme. For example, the ECC engine 302 may encode the first logical page 'abcdef' 360 by adding parity data 'xxx' to generate the codeword 'abcdefxxx' 370. Likewise, the ECC engine 302 may encode the second logical page 'ABCDEF' 361 as a second codeword 'ABCDEFyyy' 371 and may encode the third logical page '123456' 362 as a third codeword '123456zzz' 372.

The interleave module 110 is configured to receive the codewords 370-372 and to selectively interleave two or more of the codewords 370-372 according to a value of the adjustable parameter 112. For example, the interleave module 110 may be configured to generate first interleaved data 'abcABC123' 380, second interleaved data '456defDEF' 381, and third interleaved data 'yyyzzzxxx' 382 by determining that the adjustable parameter 112 has a value of three, and therefore three interleaves should be applied to the received codewords 370-372.

The MLC flash memory 108 includes multiple memory cells that may be arranged in erase blocks, such as a representative erase block 328. For example, the erase block 328 may have a size that corresponds to a smallest erasable portion of the MLC flash memory 108, and may include multiple physical pages, such as a representative physical page 312. The physical page 312 may correspond to a smallest readable unit of the MLC flash memory 108. The physical page 312 may include multiple logical pages, such as the representative logical page 314. For example, the logical page 314 may correspond to one of the logical pages illustrated in FIG. 2 that represents a single bit position stored in a set of multilevel flash memory cells.

The MLC flash memory 108 includes a log file 320 with a number of entries, such as a representative entry 322. For example, the entry 322 may include a count of errors 324 detected by the ECC engine 302 during a read of data stored at the logical page 314. In a similar manner, each logical page of the MLC flash memory 108 may have a corresponding count of errors in the log file 320.

The count of errors 324 may be used to adjust the adjustable parameter 112. For example, when the count of errors 324 is less than a predetermined threshold value, such as an error threshold value 304 that corresponds to 80% of the ECC limit 310, no interleaving may be applied when writing data to the logical page 312. When the count of errors 324 exceeds the error threshold value 304, the adjustable parameter 112 may be set to indicate that data to be stored at the corresponding logical page 314 is to be interleaved during a next data write and during subsequent data writes to the logical page 314. Thus, data stored at the logical page 314 may not be interleaved until a count of errors exceeds a threshold amount, after which the adjustable parameter 112 may be set to generate interleaved data and thus to reduce an expected peak number of errors of the logical pages at the physical page 312.

The log 320 may store a count of erase operations 326. For example, the entry 322 may correspond to the physical page 312 or to the erase block 328, and the count of erase operations 326 may correspond to a count of write/erase cycles occurring at the physical page 312 or at the erase block 328. The count of erase operations 326 may represent or may roughly correspond to an amount of wear of the MLC flash memory 108 and may indicate an increased expectation of errors occurring to data stored at the physical page 312 or at the erase block 328. As a result, when the count of erase operations 326 exceeds an erase threshold value 306 (or a threshold value of write/erase cycles), the interleave module 110 may be configured to begin interleaving data to be stored at the physical pages of the erase block 328.

During operation, the controller 106 may receive the logical pages 360-362, such as from a host device, for storage to the physical page 312 of the MLC flash memory 108. The controller 106 may provide each logical page 360-362 to the ECC engine 302 and initiate an operation of the ECC engine 302 to encode each of the logical pages 360-362 to generate the codewords 370-372.

The controller 106 may provide the codewords 370-372 to the interleave module 110. In addition, the controller 106 may update a value of the adjustable parameter 112 based on the logical pages 360-362, based on the physical page 312, or based on one or more other factors. For example, the controller 106 may access the entry 322 of the log 320 corresponding to the physical page 312 and may retrieve the count of errors 324, the count of erase operations 326, the number of interleaves 330, or other data to update the adjustable parameter 112.

The interleave module 110 may access the adjustable parameter 112 and may interleave the codewords 370-372 to generate the interleaved data 380-382 based on a value of the adjustable parameter 112. For example, the adjustable parameter 112 can be set to be equal to the count of errors 324 from a last data read operation at the physical page 312 and compared to the error threshold 304. If the adjustable parameter 112 is less than the error threshold 304, the interleave module 110 may not interleave the codewords 370-372. Otherwise, a number of interleaves may be determined based on a difference between the adjustable parameter 112 and the error threshold 304.

As another example, the adjustable parameter 112 can be set to be equal to the count of erase operations 326 that have been performed at the physical page 312 and compared to the erase threshold 306. If the adjustable parameter 112 is less than the erase threshold 306, the interleave module 110 may not interleave the codewords 370-372. Otherwise, a number of interleaves may be determined based on a difference between the adjustable parameter 112 and the erase threshold 306.

As another example, the adjustable parameter 112 may be set based on a function of multiple parameters, such as the count of errors 324, the count of erase operations 326, the number of interleaves 330, the error threshold 304, the erase threshold 306, the content of the codewords 370-372 (e.g. based on a distribution of '0' values or '1' values within one or more of the codewords 370-372), one or more other parameters, or any combination thereof.

The controller 106 may send the interleaved data 380-382 to be stored at the physical page 312. For example, the first interleaved data 380 may be stored to a top logical page of the physical page 312, the second interleaved data 381 may be stored to a middle logical page of the physical page 312, and the third interleaved data 382 may be stored to a bottom logical page of the physical page 312. The controller 106 may update the number of interleaves 330 in the entry 322 of the log 320 corresponding to the physical page 312 or corresponding to one or more logical pages, such as the logical page 314.

By increasing the number of interleaves of the interleaved data 380-382 according to an expected likelihood of errors at the MLC flash memory 108, an average number of errors in the interleaved data 380-382 may remain substantially constant and a peak number of errors in any one of the first interleaved data 380, the second interleaved data 381, and the third interleaved data 382 may be reduced. Increasing the number of interleaves from a coarse granularity to a finer granularity (e.g. reducing an interleave size from two interleaves per page to a single-bit interleave size) distributes clusters of errors that may occur due to a variety of sources, such as failed memory cell or a broken word line, and may improve error recovery.

Although the data storage device 102 of FIG. 3 is illustrated as including the count of errors 324, the count of erase operations 326, and the corresponding thresholds 304 and 306, other embodiments may not include the count of errors 324 and/or the count of erase operations 326. In addition, although the log 320 is illustrated as stored in the MLC flash memory 108, in other embodiments the log 320 or a copy of the log 320 may be maintained by the controller 106 at a volatile memory or another non-volatile memory (not shown) that is accessible to the controller 106.

Figure 4:
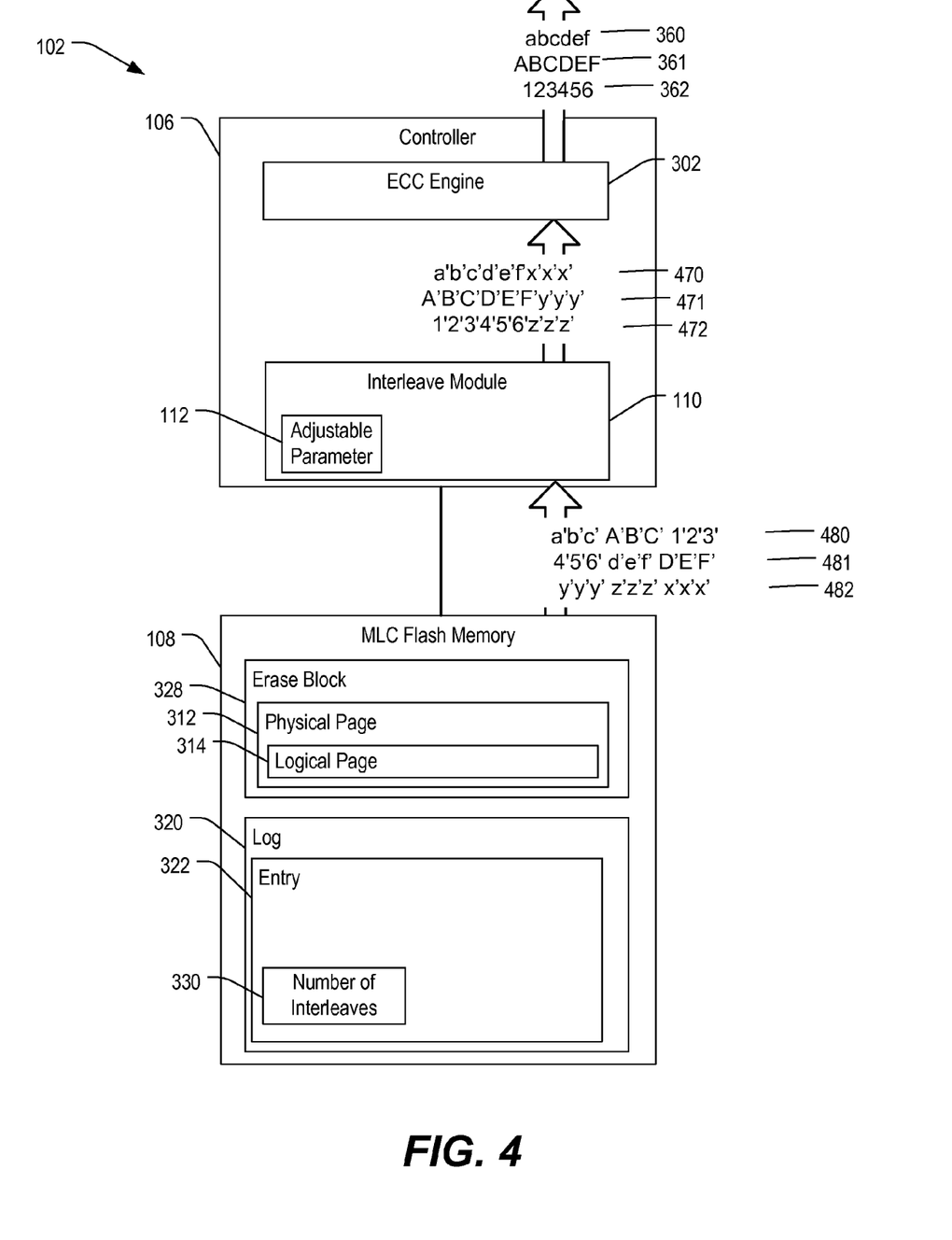
FIG. 4 is a block diagram of a particular illustrative embodiment of the data storage device 102 of FIG. 1 during a read operation that includes data de-interleaving and decoding.

FIG. 4 depicts an example of reading data from the data storage device 102 illustrated in FIG. 3. The controller 106 may receive a request, such as from a host device, for data stored at the physical page 312 of the MLC flash memory 108.

The controller 106 may read data from the physical page 312, including a first group of data 480, a second group of data 481, and a third group of data 482. The first group of data 480 corresponds to the first interleaved data 380 of FIG. 3, possibly with one or more errors that may have occurred at the MLC flash memory 108 (e.g. the set of bits "a'" of the first group 480 may differ from the set of bits "a" of the first interleaved data 380 by one or more bits). Similarly, the second group of data 481 corresponds to the second interleaved data 381 with the possible addition of one or more errors, and the third group of data 482 corresponds to the third interleaved data 382 with the possible addition of one or more errors.

The controller 106 may also retrieve the number of interleaves 330 from the entry 322 of the log 320 corresponding to the physical page 312 or corresponding to one or more logical pages from which the data 480-482 is read. The controller 106 can use the number of interleaves 330 as a value of the adjustable parameter 112 to de-interleave the data 480-482. As illustrated, the number of interleaves 330 is three for the physical page 312. However, other entries in the log 320 that correspond to other pages may indicate other numbers of interleaves. For example, data may be stored at a second page of the MLC flash memory 108 using zero interleaves (e.g. a page that had a predicted low error rate during a prior data write operation) while data stored at a third page of the MLC flash memory 108 may have more than three interleaves (e.g. a page that had a higher predicted error rate during a prior data write operation).

The interleave module 110 may access the adjustable parameter 112 and may de-interleave the data 480-482 to generate de-interleaved data 470-472. The de-interleaved data 470-472 may correspond to the codewords 370-372 of FIG. 3 with the possible addition of one or more errors.

The controller 106 may provide one or more groups of the de-interleaved data 470-472 to the ECC engine 302. For example, in response to receiving a request for data corresponding to the first logical page 360, the controller 106 may provide the first group of de-interleaved data 470 to the ECC engine 302 and initiate a first decoding operation at the ECC engine 302 to generate the first logical page 360. In response to receiving a request for data corresponding to the second logical page 361 or the third logical page 362, the controller 106 may provide the second group or third group of de-interleaved data 471 or 472, respectively, to the ECC engine 302 and initiate a decoding operation at the ECC engine 302 to generate the second logical page 361 or the third logical page 362.

Figure 5:
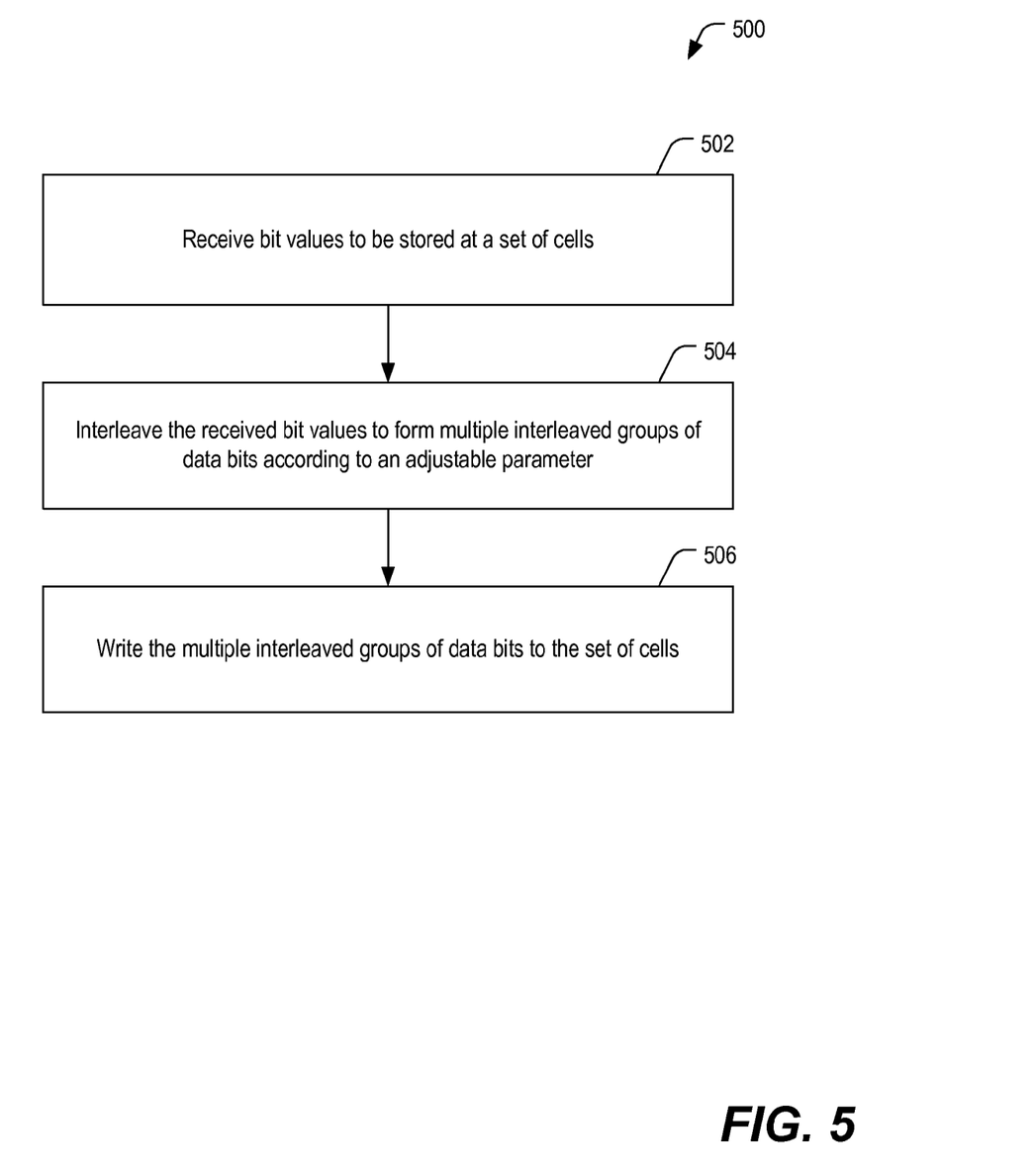
FIG. 5 is a flow diagram of a particular illustrative embodiment of a method of interleaving bit values according to an adjustable parameter.

Referring to FIG. 5, a method 500 of interleaving bit values according to an adjustable parameter is depicted. The method 500 may be performed in a data storage device with a multi-level cell (MLC) flash memory that includes a set of cells. To illustrate, the method 500 may be performed by the controller 106 of the data storage device 102 of FIG. 1.

The method 500 includes receiving bit values to be stored at the set of cells, at 502. For example the bit values 120 of FIG. 1 are received at the interleave module 110 to be stored at the set of cells 116. The set of cells may correspond to a physical page, such as the physical page 212 of FIG. 2, and the received bit values may correspond to multiple logical pages to be stored at the physical page, such as the logical pages 206-210.

The received bit values are interleaved according to an adjustable parameter to form multiple interleaved groups of data bits, at 504. For example, an interleave size may be determined based on the adjustable parameter. To illustrate, the adjustable parameter may indicate a number of interleaves corresponding to the set of cells, such as the number of interleaves 'm' of FIG. 2. As another illustration, the adjustable parameter may indicate a number of cells per interleave, such as the interleave size 118 of FIG. 1.

The adjustable parameter may be programmable. A value of the adjustable parameter may be adjusted based on a count of erase operations performed at the set of cells. For example, the controller 106 may access the count of erase operations 326 of FIG. 3 corresponding to the designated set of cells and may compare the count of erase operations 326 to the erase threshold 306 to determine how many interleaves to apply to the bit values.

A value of the adjustable parameter may be adjusted based on an error rate corresponding to data read from the set of cells. For example, the value of the adjustable parameter may be adjusted based on a count of errors occurring at a logical page stored at the set of cells exceeding a threshold value, such as the error threshold 304 of FIG. 3. To illustrate, in an implementation where the received bit values are encoded according to an error correction coding (ECC) scheme capable of correcting errors occurring in a logical page when the number of errors does not exceed an ECC limit, such as the ECC limit 310 of FIG. 3, the threshold value may be set as a percentage of the ECC limit. As an illustrative example, the threshold value may be approximately eighty percent of the ECC limit.

Interleaving the received bit values may be performed by determining a number of bits corresponding to the interleave size and generating multiple interleaved logical pages by replacing one or more sets of bits of a first logical page of the multiple logical pages with one or more other sets of bits of one or more other logical pages of the multiple logical pages. The one or more sets of bits and the one or more other sets of bits may have the determined number of bits. For example, the interleave module 110 of FIG. 1 may determine the interleave size 118 as a number of bits of each set 'a,' 'b,' 'c,' of the first group of bits 122 and may replace sets of bits from the first group 122 with sets of bits from the second group 124 and the third group 126. To illustrate, in the first interleaved group 132, the set 'b' has been replaced with the set 'A' from the second group 124 and the set 'c' has been replaced with the set '1' from the third group 126.

The multiple interleaved groups of data bits are written to the set of cells, at 506. For example, writing the multiple interleaved groups of data bits to the set of cells is performed by, for each particular cell of the set of cells, generating a multi-bit value for the particular cell. Each bit value of the multi-bit value may correspond to a bit value from a corresponding interleaved logical page of the multiple interleaved logical pages. A threshold value may be written to a particular cell corresponding to the multi-bit value for the particular cell, such as described with respect to FIG. 2.

A number of interleaves of the multiple interleaved groups may be recorded at a log maintained by a controller of the data storage device. For example, the number of interleaves 330 of FIG. 3 may be stored at the log 320 that is maintained by the controller 106. The number of interleaves 330 may be read from the log 320 when reading the stored data and used to de-interleave the read data.

Figure 6:
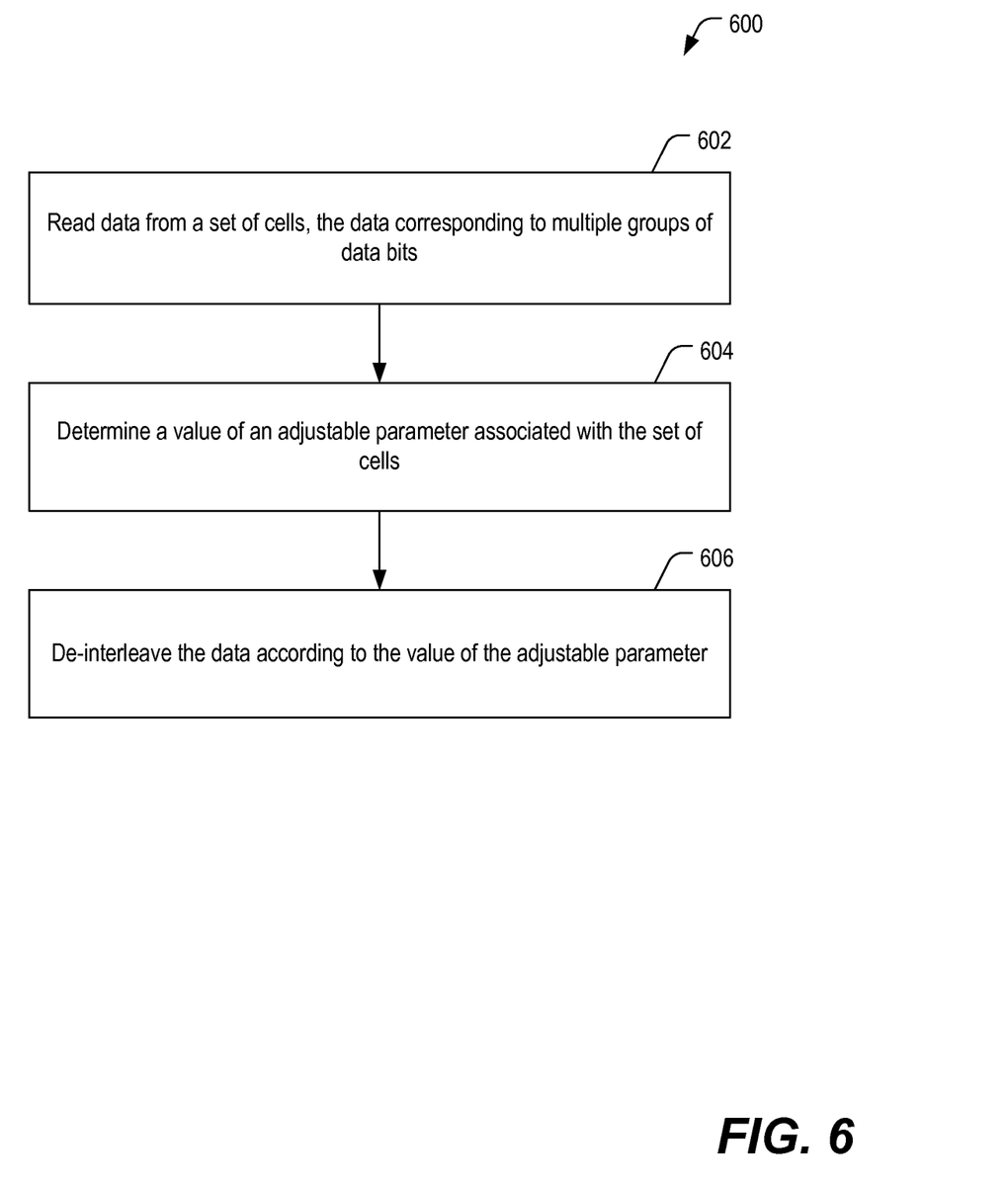
FIG. 6 is a flow diagram of a particular illustrative embodiment of a method of de-interleaving bit values according to an adjustable parameter.

Referring to FIG. 6, a method 600 of de-interleaving bit values according to an adjustable parameter is depicted. The method 600 may be performed in a data storage device with a multi-level cell (MLC) flash memory that includes a set of cells. To illustrate, the method 600 may be performed by the controller 106 of the data storage device 102 of FIG. 1.

The method 600 includes reading data from the set of cells, at 602. The data may correspond to multiple groups of data bits. For example, reading the data from the set of cells may be performed by reading multiple logical pages of data stored at a physical page, such the physical page 312 of FIG. 4. To illustrate, the first group of data 480, the second group of data 481, and the third group of data 482 may be read from the physical page 312 of FIG. 4 and may correspond to the first interleaved data 380, the second interleaved data 381, and the third interleaved data 382 of FIG. 3, with the possible addition of one or more bit errors.

A value of an adjustable parameter associated with the set of cells is determined, at 604. For example, the value of the adjustable parameter may be read from a log file stored at the memory. As an example, the value of the adjustable parameter may indicate a number of interleaves applied to the multiple groups of data bits during a prior write operation to the set of cells, such as the number of interleaves 330 read from the entry 322 of the log file 320, as described with respect to FIG. 4. As another example, the value of the adjustable parameter may indicate a number of cells per interleave applied to the multiple groups of data bits during a prior write operation to the set of cells. As another example, an indication of a number of interleaves or a number of bits per interleave may instead be retrieved from a location other than a log file, such as from one or more dedicated bits adjacent to each erase block or word line in the memory. Alternatively, one or more other values may be retrieved to determine how many interleaves were used when writing the multiple groups of data bits to the set of cells, such as the count of errors 324 or the count of erase operations 326 of FIG. 3, that may have been recorded at the time the multiple groups of data bits were written.

The data is de-interleaved according to the value of the adjustable parameter, at 606. The de-interleaved data may also be decoded. For example, each of the multiple groups of data bits may correspond to a codeword of an ECC scheme. To illustrate, the first group 480, the second group 481, and the third group 482 of FIG. 4 may be de-interleaved to generate the first group of de-interleaved data 470, the second group of de-interleaved data 471, and the third group of de-interleaved data 472. One or more of the groups of de-interleaved data 470-472 may be provided to an error correction coding (ECC) engine, such as the ECC engine 302 of FIG. 4, and a decoding operation may be initiated to decode the de-interleaved data at the ECC engine. The decoded data may be sent to an external device, such as the host device 104 of FIG. 1.

Although FIGS. 1-6 describe interleaving and de-interleaving data responsive to an adjustable parameter as implemented in a data storage device, in other embodiments interleaving and de-interleaving according to an adjustable parameter can be implemented in other systems such as a communication system. For example, the ECC engine 302 and the interleave module 110 of FIG. 3 may be implemented in a wireless transmitter to adjust an interleave of a wireless signal according to an adjustable parameter in anticipation of errors that may occur during transmission of an encoded signal.

Although the MLC flash memory 108 is illustrated as a 3-bit MLC memory, in other embodiments the MLC flash memory 108 may store two bits per cell or more than three bits per cell. Although the data storage device 102 is illustrated as having the MLC flash memory 108, in other embodiments the interleave module 110 responsive to the adjustable parameter 112 may be used with other types of memory devices, such as a static random access memory (SRAM) device, a dynamic random access memory (DRAM) device, or any other memory device that may benefit from interleaving data values to distribute peak error occurrence.

Although various components depicted herein are illustrated as block components and described in general terms, such components may include one or more microprocessors, state machines, or other circuits configured to enable the data storage device 102 of FIG. 1 to perform the particular functions attributed to such components. For example, the interleave module 110 of FIG. 1 may represent physical components, such as hardware controllers, state machines, logic circuits, or other structures, to enable the interleave module 110 to interleave received data according to the adjustable parameter 112.

The interleave module 110 may be implemented as dedicated hardware (i.e. circuitry) for reduced latency. Alternatively, the interleave module 110 may be implemented using a microprocessor or microcontroller programmed to perform interleaving among multiple groups of data bits according to the adjustable parameter. In a particular embodiment, the interleave module 110 includes executable instructions that are executed by a processor and the instructions are stored at the MLC flash memory 108. Alternatively, or in addition, executable instructions that are executed by a processor that may be included in the controller 106 may be stored at a separate memory location that is not part of the MLC flash memory 108, such as at a read-only memory (ROM) (not shown).

In a particular embodiment, the data storage device 102 may be a portable device configured to be selectively coupled to one or more external devices. However, in other embodiments, the data storage device 102 may be attached or embedded within one or more host devices, such as within a housing of a portable communication device. For example, the data storage device 102 may be within a packaged apparatus such as a wireless telephone, personal digital assistant (PDA), gaming device or console, portable navigation device, or other device that uses internal non-volatile memory. In a particular embodiment, the data storage device 102 includes a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device with a controller and a memory, the memory including a set of cells, performing:
receiving bit values to be stored at the set of cells;
interleaving the received bit values to form multiple interleaved groups of data bits according to an adjustable parameter, wherein the adjustable parameter is adjusted by the controller; and
writing the multiple interleaved groups of data bits to the set of cells.

2. The method of claim 1, wherein the memory includes a multi-level cell (MLC) flash memory.

3. The method of claim 1, wherein the set of cells corresponds to a physical page and where the received bit values correspond to multiple logical pages to be stored at the physical page.

4. The method of claim 1, further comprising determining an interleave size based on the adjustable parameter.

5. The method of claim 4, wherein the adjustable parameter indicates a number of interleaves corresponding to the set of cells.

6. The method of claim 4, wherein the adjustable parameter indicates a number of cells per interleave.

7. The method of claim 1, wherein the adjustable parameter is programmable.

8. The method of claim 7, further comprising adjusting a value of the adjustable parameter based on a count of erase operations performed at the set of cells.

9. The method of claim 1, further comprising adjusting a value of the adjustable parameter based on an error rate corresponding to data read from the set of cells.

10. The method of claim 9, further comprising adjusting a value of the adjustable parameter based on a count of errors occurring at a logical page stored at the set of cells exceeding a threshold value.

11. The method of claim 1, wherein the received bit values are encoded according to an error correction coding (ECC) scheme capable of correcting a number of errors occurring in a logical page when the number of errors does not exceed an ECC limit.

12. The method of claim 11, wherein the threshold value is approximately eighty percent of the ECC limit.

13. The method of claim 1, further comprising recording a number of interleaves of the multiple interleaved groups at a log maintained by a controller of the data storage device.

14. The method of claim 1, wherein the set of cells corresponds to a physical page, wherein the received bit values correspond to multiple logical pages to be stored at the physical page, and wherein the adjustable parameter indicates an interleave size,
wherein interleaving the received bit values is performed by:
determining a number of bits corresponding to the interleave size; and
generating multiple interleaved logical pages by replacing one or more sets of bits of a first logical page of the multiple logical pages with one or more other sets of bits of one or more other logical pages of the multiple logical pages, the one or more set of bits and the one or more other sets of bits having the determined number of bits, and
wherein writing the multiple interleaved groups of data bits to the set of cells is performed by, for each particular cell of the set of cells:
generating a multi-bit value for the particular cell, wherein each bit value of the multi-bit value corresponds to a bit value from a corresponding interleaved logical page of the multiple interleaved logical pages; and
writing a threshold value to the particular cell corresponding to the multi-bit value for the particular cell.

15. A data storage device comprising:
a memory; and
a controller configured to:
receive bit values to be stored at a set of cells of the memory;
interleave the received bit values to form multiple interleaved groups of data bits according to an adjustable parameter, wherein the adjustable parameter is adjusted by the controller; and
write the multiple interleaved groups of data bits to the set of cells.

16. The data storage device of claim 15, wherein the memory includes a multi-level cell (MLC) flash memory.

17. The data storage device of claim 15, wherein the controller is configured to determine an interleave size based on the adjustable parameter or a count of erase operations performed at the set of cells.

18. The data storage device of claim 15, wherein the controller is configured to adjust a value of the adjustable parameter based on an error rate corresponding to data read from the set of cells.

19. The data storage device of claim 18, wherein the controller is configured to adjust the value of the adjustable parameter in response to a count of errors occurring at a logical page stored at the set of cells exceeding a threshold value.

20. The data storage device of claim 15, wherein the controller is configured to record a number of interleaves of the multiple interleaved groups at a log that is maintained by the controller.

21. The data storage device of claim 15, wherein the controller and the memory are included in one of:
a removable memory card;
an embedded memory; or
a solid-state storage drive.

22. A method comprising:
in a data storage device with a controller and a multi-level cell (MLC) flash memory, the MLC flash memory including a set of cells, performing:
receiving bit values corresponding to multiple logical pages to be stored at a physical page corresponding to the set of cells;
generating multiple interleaved logical pages by interleaving the multiple logical pages based on an adjustable parameter, wherein the adjustable parameter is adjusted by the controller; and
writing a threshold value to each particular cell of the set of cells, the threshold value corresponding to a multi-bit value for the particular cell, wherein each bit value of the multi-bit value corresponds to a bit value from a corresponding interleaved logical page of the multiple interleaved logical pages.

23. The method of claim 22, wherein the adjustable parameter indicates a number of interleaves corresponding to the set of cells.

24. The method of claim 22, wherein the adjustable parameter indicates a number of cells per interleave.

25. A method comprising:
in a data storage device with a controller and a memory, the memory including a set of cells, performing:
reading data from the set of cells, the data corresponding to multiple groups of data bits;
determining a value of an adjustable parameter associated with the set of cells, wherein the value of the adjustable parameter is adjusted by the controller; and
de-interleaving the data according to the value of the adjustable parameter.

26. The method of claim 25, wherein the value of the adjustable parameter is read from a log file stored at the memory.

27. The method of claim 25, wherein the value of the adjustable parameter indicates a number of interleaves applied to the multiple groups of data bits during a prior write operation to the set of cells.

28. The method of claim 25, wherein the value of the adjustable parameter indicates a number of cells per interleave applied to the multiple groups of data bits during a prior write operation to the set of cells.

29. The method of claim 25, wherein the data storage device further includes an error correction coding (ECC) engine, wherein each of the multiple groups of data bits corresponds to a codeword of an ECC scheme, and further comprising initiating a decoding operation to decode the de-interleaved data at the ECC engine.

30. The method of claim 25, wherein the memory includes a multi-level cell (MLC) flash memory.

* * * * *